(12) United States Patent
Reznicek et al.

(10) Patent No.: US 10,784,194 B2
(45) Date of Patent: Sep. 22, 2020

(54) BEOL EMBEDDED HIGH DENSITY VERTICAL RESISTOR STRUCTURE

(71) Applicant: International Business Machines Corporation, Armonk, NY (US)

(72) Inventors: Alexander Reznicek, Troy, NY (US); Oscar van der Straten, Guilderland Center, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/531,846

(22) Filed: Aug. 5, 2019

(65) Prior Publication Data

US 2019/0355661 A1    Nov. 21, 2019

Related U.S. Application Data

(62) Division of application No. 15/847,248, filed on Dec. 19, 2017, now Pat. No. 10,410,966.

(51) Int. Cl.
| | |
|---|---|
| *H01L 23/522* | (2006.01) |
| *H01L 49/02* | (2006.01) |
| *H01L 21/768* | (2006.01) |
| *H01L 27/08* | (2006.01) |

(52) U.S. Cl.
CPC .... *H01L 23/5228* (2013.01); *H01L 21/76843* (2013.01); *H01L 21/76877* (2013.01); *H01L 23/5226* (2013.01); *H01L 27/0802* (2013.01); *H01L 28/20* (2013.01); *H01L 28/24* (2013.01); *H01L 2924/19043* (2013.01)

(58) Field of Classification Search
CPC ......... H01L 21/76877; H01L 21/76843; H01L 23/5226; H01L 21/76885; H01L 23/5228; H01L 27/0802; H01L 28/20; H01L 28/24; H01L 2924/19043
See application file for complete search history.

(56) References Cited

U.S. PATENT DOCUMENTS

| | | | |
|---|---|---|---|
| 4,228,450 | A | 10/1980 | Anantha et al. |
| 4,690,728 | A | 9/1987 | Tsang et al. |
| 5,330,930 | A | 7/1994 | Chi |
| 5,805,049 | A | 9/1998 | Yamada et al. |
| 5,838,044 | A | 11/1998 | Chang et al. |
| 6,500,724 | B1 | 12/2002 | Zurcher et al. |
| 6,580,130 | B1 | 6/2003 | Schoellkopf et al. |
| 6,700,203 | B1 | 3/2004 | Cabral, Jr. et al. |
| 7,768,055 | B2 | 8/2010 | Chinthakindi et al. |
| 7,949,983 | B2 | 5/2011 | Eshun et al. |
| 8,013,394 | B2 | 9/2011 | Chinthakindi et al. |

(Continued)

OTHER PUBLICATIONS

List of IBM Patents or Patent Applications Treated as Related dated Aug. 5, 2019, 2 pages.

*Primary Examiner* — Didarul A Mazumder
*Assistant Examiner* — Wasiul Haider
(74) *Attorney, Agent, or Firm* — Scully, Scott, Murphy & Presser, P.C.; Daniel P. Morris, Esq.

(57) ABSTRACT

Embedded resistors which have tunable resistive values located between interconnect levels are provided. The embedded resistors have a pillar structure, i.e., they have a height that is greater than their width, thus they occupy less real estate as compared with conventional planar resistors that are typically employed in BEOL technology.

20 Claims, 2 Drawing Sheets

(56) References Cited

U.S. PATENT DOCUMENTS

| | | |
|---|---|---|
| 8,563,336 B2 | 10/2013 | Chen et al. |
| 9,064,786 B2 | 6/2015 | Di Sarro et al. |
| 9,305,997 B1 | 4/2016 | Zhang |
| 2002/0074949 A1 | 6/2002 | Aoki et al. |
| 2007/0181974 A1 | 8/2007 | Coolbaugh et al. |
| 2009/0243122 A1 | 10/2009 | Summerfelt et al. |
| 2011/0096588 A1 | 4/2011 | Fasoli |
| 2011/0244636 A1 | 10/2011 | Kondo |
| 2012/0286231 A1 | 11/2012 | Saito et al. |
| 2014/0008764 A1 | 1/2014 | Yang et al. |
| 2014/0103284 A1 | 4/2014 | Hsueh et al. |
| 2014/0269005 A1 | 9/2014 | Kang |
| 2016/0037643 A1 | 2/2016 | Kim et al. |
| 2017/0162646 A1* | 6/2017 | Lee .................. H01L 23/66 |
| 2018/0097001 A1* | 4/2018 | Bi .................... H01L 28/20 |
| 2018/0130414 A1 | 5/2018 | Hekmatshoartabari et al. |
| 2018/0197936 A1 | 7/2018 | Edelstein et al. |
| 2018/0231424 A1 | 8/2018 | Nurmetov et al. |

\* cited by examiner

BEOL EMBEDDED HIGH DENSITY VERTICAL RESISTOR STRUCTURE

BACKGROUND

The present application relates to a semiconductor structure and a method of forming the same. More particularly, the present application relates to a high density vertical resistor structure that is embedded in a dielectric material and is located between different interconnect levels. The present application also provides a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

Resistors are needed in back-end-of-the-line (BEOL) interconnect technology to balance overall RC loads and improve circuit performance. Typical resistors for BEOL interconnect levels include expanded, planar resistors which occupy a large amount of real estate at high cost. As device dimensions continue to scale down, there is an ever increasing need for resistivity control of the resistor materials employed.

There is thus a need for embedded resistors in BEOL technology which occupy a significant reduced area on the chip, while allowing tunable resistance values.

SUMMARY

Embedded resistors which have tunable resistance values located between interconnect levels are provided. The embedded resistors have a pillar structure, i.e., they have a height that is greater than their width, thus they occupy less real estate as compared with conventional planar resistors that are typically employed in BEOL technology.

In one aspect of the present application, a semiconductor structure is provided. In one embodiment, the semiconductor structure may include a lower interconnect level including a first metal-containing structure embedded in a first interconnect dielectric material layer, and an upper interconnect level located above the lower interconnect level. The upper interconnect level includes a second metal-containing structure located in a second interconnect dielectric material layer. A dielectric material layer is located between the lower and upper interconnect levels. The dielectric material layer includes a resistor structure comprising at least one vertical resistor element that contacts both the first and second metal-containing structures.

In another aspect of the present application, a method of forming a semiconductor structure is provided. In one embodiment, the method may include forming a lower interconnect level that includes at least one first metal-containing structure embedded in a first interconnect dielectric material layer. Next, a plurality of spaced apart mandrel structures are formed above the lower interconnect level. A resistor material pillar is then formed on opposing sidewall surfaces of each of the mandrel structures, and thereafter each of the mandrel structures are removed. A dielectric material layer is formed between each resistor material pillar. Next, an upper interconnect level that includes at least one second metal-containing structure located in a second interconnect dielectric material layer is formed. In accordance with the present application, at least one of the resistor material pillars contacts both the first and second metal-containing structures.

DETAILED DESCRIPTION

Figure 2:
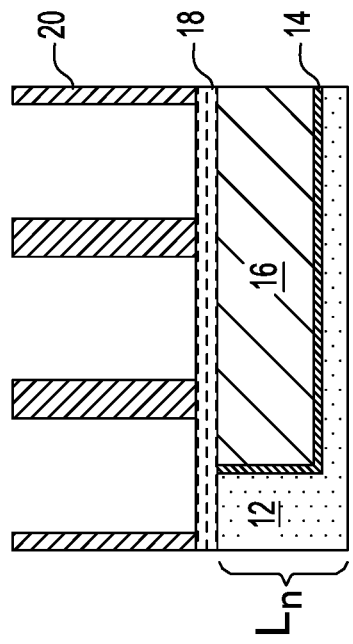
FIG. 2 is a cross sectional view of the exemplary semiconductor structure of FIG. 1 after forming a plurality of spaced apart mandrel structures above the lower interconnect level.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
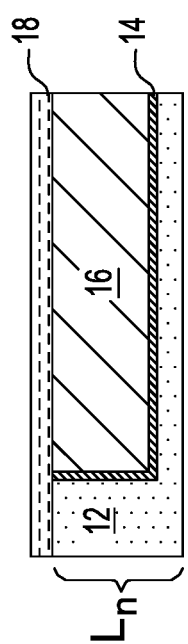
FIG. 1 is a cross sectional view of an exemplary semiconductor structure that can be employed in accordance with an embodiment of the present application and including a lower interconnect level that includes at least one first metal-containing structure embedded in a first interconnect dielectric material layer.

Referring first to FIG. 1, there is illustrated an exemplary semiconductor structure that can be employed in accordance with an embodiment of the present application. The exemplary semiconductor structure of FIG. 1 includes a lower interconnect level, $L_n$, that includes at least one first metal-containing structure 16 embedded in a first interconnect dielectric material layer 12; the at least one first metal-containing structure 16 is electrically conductive. It is noted that FIG. 1 and the remaining drawings, only show a portion of a BEOL structure in which a resistor structure containing vertically resistor elements in accordance with the present application will be subsequently formed.

Although not shown in the drawings, a semiconductor substrate that contains a plurality of semiconductor devices formed therein or thereupon can be located beneath the lower interconnect level, $L_n$, illustrated in FIG. 1 of the present application.

In some embodiments of the present application, a first diffusion barrier liner 14 may be present that surrounds the sidewalls and the bottom wall (i.e., bottommost surface) of the at least one first metal-containing structure 16 which is embedded in the first interconnect dielectric material layer 12. As is shown, the first metal-containing structure 16 and the first diffusion barrier liner 14 have topmost surfaces that are coplanar with each other as well as being coplanar with a topmost surface of the first interconnect dielectric material layer 12. In some embodiments, the first diffusion barrier liner 14 may be omitted from the lower interconnect level, $L_n$.

The first interconnect dielectric material layer 12 of the lower interconnect level, $L_n$, may be composed of an inorganic dielectric material or an organic dielectric material. In some embodiments, first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening (not shown) is formed into the first interconnect dielectric material layer 12; each opening will house a first metal-containing structure 16 and, if present, the first diffusion barrier liner 14. The at least one opening in the first interconnect dielectric material layer 12 may be a via opening, a line opening and/or combined a via/lines opening. The at least one opening may be formed by lithography and etching. In embodiments in which a combined via/line opening is formed, a second iteration of lithography and etching may be used to form such an opening.

In some embodiments, a first diffusion barrier material is then formed within the at least one opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirety fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, a first interconnect metal or metal alloy is formed into each opening and, if present, atop the first diffusion barrier material. The first interconnect metal or metal alloy provides the first metal-containing structure 16 of the present application. The first interconnect metal or metal alloy may be composed of copper (Cu), aluminum (Al) or an alloy thereof such as, for example, a Cu—Al alloy. The first interconnect metal or metal alloy can be formed utilizing a deposition process such as, for example, CVD, PECVD, sputtering, chemical solution deposition or plating. In one embodiment, a bottom-up plating process is employed in forming the first interconnect metal or metal alloy. In some embodiments, the first interconnect metal or metal alloy is formed above the topmost surface of the first interconnect dielectric material layer 12.

Following the deposition of the first interconnect metal or metal alloy, a planarization process such as, for example, chemical mechanical polishing (CMP) and/or grinding, can be used to remove all interconnect metal or metal alloy (i.e., overburden material) that is present outside each of the openings forming the first metal-containing structure 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in the at least one opening is referred to herein as the first diffusion barrier liner 14, while the remaining first interconnect metal or metal alloy that is present in the at least one opening may be referred to as the first metal-containing structure 16. Collectively, the first interconnect dielectric material layer 12, each optional first diffusion barrier liner 14, and each first metal-containing structure 16 define the lower interconnect level, $L_n$, of the present application.

Next, and in some embodiments, a capping layer 18 can be formed on the physically exposed topmost surface of the lower interconnect level, $L_n$, of the present application. In some embodiments, capping layer 18 can be omitted. When present, the capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the capping layer 18 may be formed utilizing a deposition process such as, for example, CVD, PECVD, ALD, chemical solution deposition or evaporation. When present, capping layer 18 may have a thickness from 10 nm to 100 nm. Other thicknesses that are lesser than 10 nm, or greater than 100 nm may also be used as the thickness of the capping layer 18.

Referring now to FIG. 2, there is illustrated the exemplary semiconductor structure of FIG. 1 after forming a plurality of spaced apart mandrel structures 20 above the lower interconnect level, $L_n$. Each mandrel structure 20 may have a height from 10 nm to 250 nm, and a width from 6 nm to 200 nm. Each mandrel structure 20 is spaced apart by a gap that is from 30 nm to 500 nm.

The plurality of spaced apart mandrel structures 20 may be formed by first providing a mandrel material layer (not shown) on the exemplary structure shown in FIG. 1, with or without the capping layer 18. The mandrel material layer can include any material (semiconductor, dielectric or conductive) that can be selectively removed from the structure during a subsequently performed etching process. In one embodiment, the mandrel material layer (not shown) may be composed of silicon nitride, or amorphous carbon. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures 20 as shown in FIG. 2.

Figure 3:
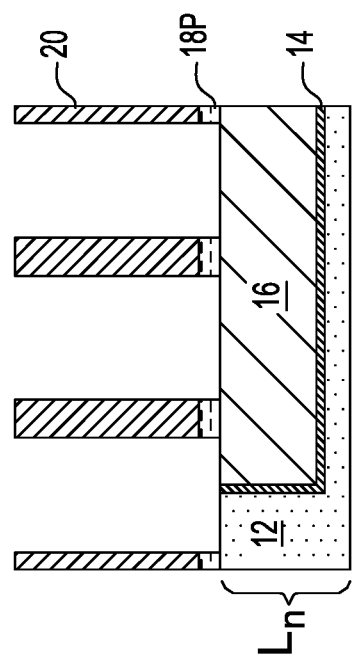
FIG. 3 is a cross sectional view of the exemplary semiconductor structure of FIG. 2 after performing an etch that transfers the pattern of the plurality of spaced apart mandrel structures to the capping layer that may be present on the lower interconnect level.

Referring now to FIG. 3, there is illustrated the exemplary semiconductor structure of FIG. 2 after performing an etch that transfers the pattern of the plurality of spaced apart mandrel structures 20 to the capping layer 18 that may, or may not, be present on the lower interconnect level, $L_n$. In embodiments in which the capping layer 18 is omitted, this step of the present application may be omitted. The capping layer 18 open etch may include any isotropic etching process such as, for example, reactive ion etching.

After transferring the pattern to the capping layer 18, a portion of the capping layer 18 remains beneath each mandrel structure 20. Each remaining portion of the capping layer 18 that is present beneath one of the mandrel structures 20 may be referred to herein as a capping layer portion 18P. As is shown, each capping layer portion 18P has sidewall surfaces that are vertically aligned with the sidewall surfaces of one of the overlying mandrel structures 20.

Figure 4:
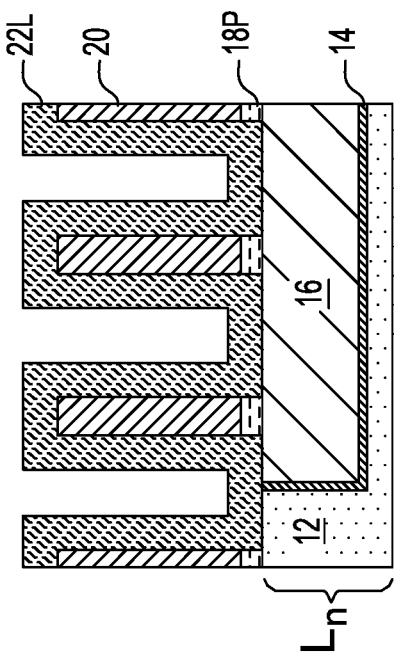
FIG. 4 is a cross sectional view of the exemplary semiconductor structure of FIG. 3 after forming a resistor material layer.

Referring now to FIG. 4, there is illustrated the exemplary semiconductor structure of FIG. 3 after forming a resistor material layer 22L. The resistor material layer 22L is formed on the physically exposed surfaces of the mandrel structures 20, if present, the capping layer portions 18P, and portions of the lower interconnect level, $L_n$. As is shown, the resistor material layer 22L partially, but not completely, fills in the gap that is present between each of the mandrel structures 20.

The resistor material layer 22L is composed of any ceramic conductor material such as, for example, a metal nitride, a metal oxide or a multilayered stack thereof. Examples of metal nitrides that can be used as the resistor material layer 22L include, but are not limited to, tantalum nitride (TaN), niobium nitride (NbN), vanadium nitride (VN), titanium nitride (TiN) or tungsten nitride (WN). For metal nitrides, tailored resistivity values can be obtained by varying the nitrogen content of the metal nitride composition. In one example, TaN having a resistivity from 200 µΩcm to 10,000 µΩcm can be used. Examples of metal oxide that can be employed include, but are not limited to, ruthenium oxide (RuO), osmium oxide (OsO), rhodium oxide (RhO) or iridium oxide (IrO). The metal oxides may be used with a base layer of a same metal, i.e., RuO can be used with a base layer of Ru. For metal oxides, tailored resistivity values can be obtained by varying the oxygen content of the metal oxide composition. In one example, RuO having a resistivity from 20 µΩcm to 200 µΩcm can be used as the resistor material layer.

The resistor material layer 22L can be formed utilizing a deposition process such as, for example, chemical vapor deposition (CVD), plasma enhanced chemical vapor deposition (PECVD), atomic layer deposition (ALD), or physical vapor deposition (PVD). In some embodiments, the resistor material layer 22L is a conformal layer.

Figure 5:
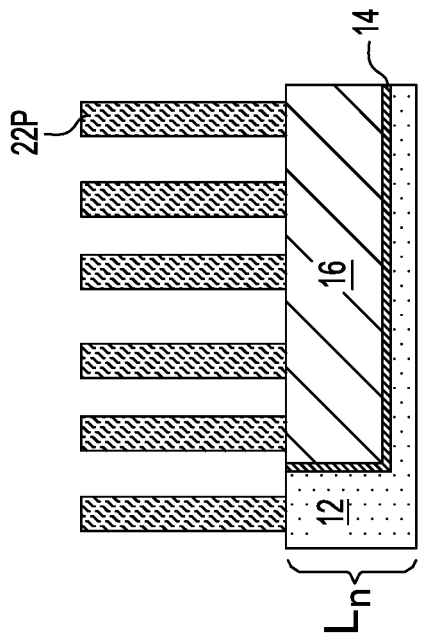
FIG. 5 is a cross sectional view of the exemplary semiconductor structure of FIG. 4 after removing horizontal portions of the resistor material layer to provide a plurality of spaced apart resistor material pillars.

Referring now to FIG. 5, there is illustrated the exemplary semiconductor structure of FIG. 4 after removing horizontal portions of the resistor material layer 22L to provide a plurality of spaced apart resistor material pillars 22P. The removal of the horizontal portions of the resistor material layer 22L can be performed utilizing a spacer etching process such as, for example, reactive ion etching. A resistor material pillar 22P is present on opposing sidewall surfaces of at least each of the mandrel structure 20, and, if present, on opposing sidewall surfaces of the underlying capping layer portion 18P.

Each resistor material pillar 22P may have a height from 40 nm to 300 nm, and a width from 2 nm to 100 nm. At this point of the present application, each resistor material pillar 22P has a topmost surface that is coplanar with a topmost surface of each of the mandrel structures 20.

Figure 6:
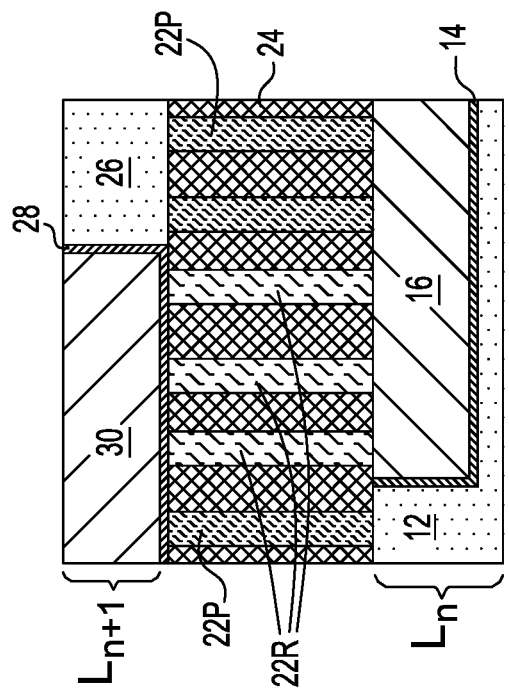
FIG. 6 is a cross sectional view of the exemplary semiconductor structure of FIG. 5 after removing each mandrel structure and the underlying portions of the capping layer.

Referring now to FIG. 6, there is illustrated the exemplary semiconductor structure of FIG. 5 after removing each mandrel structure 20 and the underlying portions of the capping layer (i.e., capping layer portions 18P). In embodiments in which no capping layer 18 is present, this step removes only the mandrel structures 20.

The removal of the mandrel structures 20 and, if present, the capping layer portions 18P can be performed utilizing one or more etching processes that are selective in removing the mandrel material and, if present, the dielectric material that provides the capping layer portions 18P. In one embodiment, a first etch is used to remove each of the mandrel structures 20, and a second etch, different from the first etch, is used to remove each capping layer portion 18P. In another embodiment, a single etch can be used to remove both the mandrel structures 20 and the capping layer portions 18P.

Figure 7:
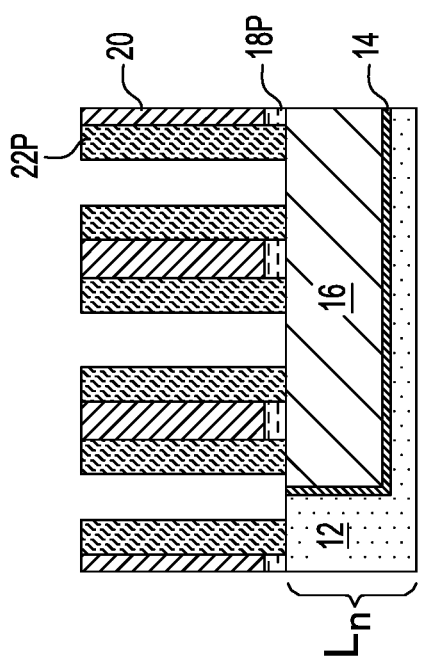
FIG. 7 is a cross sectional view of the exemplary semiconductor structure of FIG. 6 after forming a dielectric material layer between each resistor material pillar.

Referring now to FIG. 7, there is illustrated the exemplary semiconductor structure of FIG. 6 after forming a dielectric material layer 24 between each resistor material pillar 22P. Dielectric material layer 24 may include one of the dielectric materials mentioned above for the first interconnect dielectric layer 12. In one embodiment, the dielectric material layer 24 is composed of a same dielectric material as the first interconnect dielectric material layer 12. In another embodiment, the dielectric material layer 24 is composed of a different dielectric material than the first interconnect dielectric material layer 12. The dielectric material layer 24 may be formed utilizing a conventional deposition process. In some embodiments, a planarization process, as defined above, may be used to provide the structure shown in FIG. 7.

As shown in FIG. 7, the dielectric material later 24 laterally surrounds each resistor material pillar 22P and has a topmost surface that is coplanar with a topmost surface of each of the resistor material pillars 22P.

Figure 8:
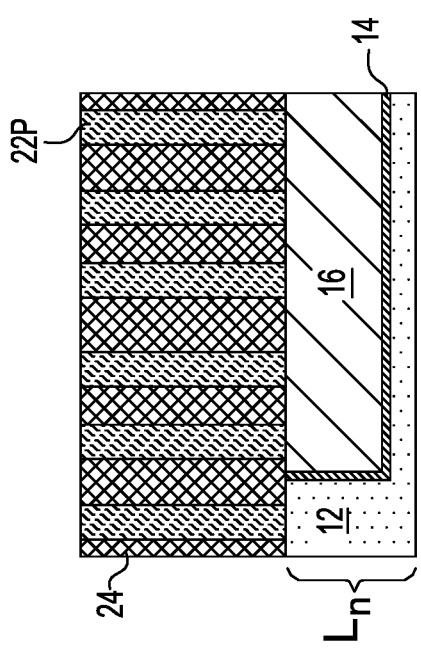
FIG. 8 is a cross sectional view of the exemplary semiconductor structure of FIG. 7 after forming an upper interconnect level that includes at least one second metal-containing structure located in a second interconnect dielectric material layer.

Referring now to FIG. 8, there is illustrated the exemplary semiconductor structure of FIG. 7 after forming an upper interconnect level, $L_{n+1}$, that includes at least one second metal-containing structure 30 located in a second interconnect dielectric material layer 26. As is shown, some of the resistor material pillars have a bottommost surface that directly contacts the first metal-containing structure 16 and a topmost surface that contacts (directly or indirectly through the second diffusion barrier liner 28) the second-metal-containing structure 30. Such resistor material pillars that are in contact with the first and second-metal-containing structures (16, 30) may be referred to herein as resistor elements 22R of a resistor structure. As is shown, the resistor elements 22R (which are vertically orientated resistor pillars) are located between the lower and upper interconnect levels and are embedded within dielectric material layer 24. Although the present application describes and illustrates three resistor elements 22R, the present application is not limited to only three resistor elements 22R. Instead, the present application may include less than three resistor elements 22R or more than three resistor elements 22R. Thus, the present application contemplates embodiments in which at least one resistor element 22R is present.

The upper interconnect level, $L_{n+1}$, can be formed utilizing the technique mentioned above in forming the lower interconnect level, $L_n$. Notably, the second interconnect dielectric material layer 26 is formed on the exemplary structure shown in FIG. 7. The second interconnect dielectric material layer 26 may be formed utilizing one of the deposition processes mentioned above in forming the first interconnect dielectric material layer 12. The second interconnect dielectric material layer 26 may include one of the interconnect dielectric materials mentioned above for the first interconnect dielectric material layer 12. In one embodiment, the second interconnect dielectric material layer 26 is composed of a same interconnect dielectric material as the first interconnect dielectric material layer 12. In another embodiment, the second interconnect dielectric material layer 26 is composed of a different interconnect dielectric material than the first interconnect dielectric material layer 12. The second interconnect dielectric material layer 26 may be a same dielectric material, or a different dielectric material than, the dielectric material layer 24 that is formed between each resistor material pillar 22P. In some embodiments of the present application, the first interconnect dielectric material layer 12, the dielectric material layer 24 and the second interconnect dielectric material layer 26 are composed of a same dielectric material.

After forming the second interconnect dielectric material layer 26, an opening is formed entirely through a portion of the second interconnect dielectric material layer 26. The opening will house the second metal-containing structure 30 and, if present, a second diffusion barrier liner 28. The opening that is formed the second interconnect dielectric material layer 26 may be a via opening, a line opening and/or combined a via/lines opening. The at least one opening may be formed by lithography and etching. In embodiments in which a combined via/line opening is formed, a second iteration of lithography and etching may be used to form such an opening.

In some embodiments, a second diffusion barrier material is then formed within the opening and on an exposed topmost surface of the second interconnect dielectric material layer 26; the second diffusion barrier material will provide the second diffusion barrier liner 28 mentioned above. The second diffusion barrier material may include one of the diffusion barrier materials mentioned above for the first diffusion barrier liner 14. The second diffusion barrier material may be formed, and have a thickness, as described above for the first diffusion barrier material.

In some embodiments, an optional plating seed layer (not specifically shown, and as defined above) can be formed on the surface of the second diffusion barrier material. Next, a second interconnect metal or metal alloy is formed into the opening and, if present, atop the second diffusion barrier material. The second interconnect metal or metal alloy provides the second metal-containing structure 30 of the present application; second metal-containing structure 30 is also electrically conductive. The second interconnect metal or metal alloy may be composed of one of the metal or metal alloys mentioned above for the first interconnect metal or metal alloy. In one embodiment, the second interconnect metal or metal alloy is composed of a different metal or metal alloy than the first interconnect metal or metal alloy. In yet another embodiment, the second interconnect metal or metal alloy is a same metal or metal alloy as the first interconnect metal or metal alloy. The second interconnect metal or metal alloy may be formed utilizing one of the techniques mentioned above in providing the first interconnect metal or metal alloy. Following the formation of the second interconnect metal or metal alloy, a planarization process such as, for example, chemical mechanical polishing (CMP) and/or grinding, can be used to remove all second interconnect metal or metal alloy (i.e., overburden material) that is present outside the opening forming the second metal-containing structure 30 shown in FIG. 8. The planarization stops on a topmost surface of the second interconnect dielectric material layer 26. Thus, and if present, the planarization process also removes the second diffusion barrier material from the topmost surface of the second interconnect dielectric material layer 26. The remaining portion of the second diffusion barrier material that is present in the opening is referred to herein as the second diffusion barrier liner 28, while the remaining second interconnect metal or metal alloy that is present in the opening may be referred to as the second metal-containing structure 30. Collectively, the second interconnect dielectric material layer 26, the optional second diffusion barrier liner 28 and the second metal-containing structure 30 define the upper interconnect level, $L_{n+1}$ of the present application.

Notably, the exemplary structure of FIG. 8 includes a lower interconnect level, $L_n$, including a first metal-containing structure 16 embedded in a first interconnect dielectric material layer 12. An upper interconnect level, $L_{n+1}$, is located above the lower interconnect level, $L_n$. The upper interconnect level, $L_{n+1}$, includes a second metal-containing structure 30 located in a second interconnect dielectric material layer 26. A dielectric material layer 24 is located between the lower and upper interconnect levels ($L_n$, $L_{+1}$). The dielectric material layer 24 includes a resistor structure comprising at least one vertical resistor element 22R that contacts both the first and second metal-containing structures (16, 30). As is also illustrated, at least one resistor material pillar 22P located in the dielectric material 24 contacts a surface of the first or second interconnect dielectric material layer (12, 26). Such resistor material pillars 22P are inactive.

It is noted that the resistor structure of the present application can provide tunable resistance values enabled by at least one of the following (a) the choice of the resistor element 22R height, (b) resistor element 22R material, and (c) the number of resistor elements 22R that contact the first and second metal-containing structures (16, 20).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming a lower interconnect level that includes at least one first metal-containing structure embedded in a first interconnect dielectric material layer;
   forming a plurality of spaced apart mandrel structures above the lower interconnect level;
   forming a resistor material pillar on opposing sidewall surfaces of each of the mandrel structures;
   removing each mandrel structure;
   forming a dielectric material layer between each resistor material pillar; and
   forming an upper interconnect level that includes at least one second metal-containing structure located in a second interconnect dielectric material layer, wherein at least one of the resistor material pillars contacts both the first and second metal-containing structures.

2. The method of claim 1, wherein the forming the resistor material pillar comprises:
   depositing a resistor material layer; and
   performing a spacer etch.

3. The method of claim 2, wherein the spacer etch removes horizontal portions of the resistor material layer.

4. The method of claim 3, wherein the spacer etch comprises reactive ion etching.

5. The method of claim 1, wherein the resistor material pillar composed of a ceramic conductor material.

6. The method of claim 5, wherein the ceramic conductor material comprises a metal nitride, a metal oxide or a combination thereof.

7. The method of claim 6, wherein the metal nitride comprises tantalum nitride (TaN), niobium nitride (NbN), vanadium nitride (VN), titanium nitride (TiN) or tungsten nitride (WN).

8. The method of claim 6, wherein the metal oxide comprises ruthenium oxide (RuO), osmium oxide (OsO), rhodium oxide (RhO) or iridium oxide (IrO).

9. The method of claim 1, wherein the resistor material pillar comprises TaN having a resistivity from 200 μΩcm to 10,000 μΩcm.

10. The method of claim 1, wherein the resistor material pillar comprises RuO having a resistivity from 20 μΩcm to 200 μΩcm.

11. The method of claim 1, wherein each resistor material pillar has a topmost surface that is coplanar with a topmost surface of each mandrel structure.

12. The method of claim 1, further comprising forming a capping layer on the lower interconnect layer prior to forming the plurality of mandrel structures.

13. The method of claim 12, further comprising transferring a pattern of the mandrel structures into the capping layer prior to forming the resistor material pillar.

14. The method of claim 1, wherein the first interconnect dielectric material layer, the dielectric material layer and the second interconnect dielectric material layer comprise a same dielectric material.

15. The method of claim 1, wherein at least one of the resistor material pillars contacts has a topmost surface that contacts directly a surface of the second interconnect dielectric material layer.

16. The method of claim 1, wherein at least one of the resistor material pillars contacts has a bottommost surface that contacts directly a surface of the second interconnect dielectric material layer.

17. The method of claim 1, wherein a diffusion barrier liner is formed that separates a topmost surface of the at least one of resistor material pillar that contacts both the first and second metal-containing structures from a bottommost surface of the second metal-containing structure.

18. The method of claim 1, wherein the mandrel structure is composed of silicon nitride or amorphous silicon.

19. The method of claim 1, wherein each of the resistor material pillars has a height that is greater than a width.

20. The method of claim 19, wherein the height of each of the resistor material pillars is from 40 nm to 300 nm, and the width of each of the resistor material pillars from 2 nm to 100.

* * * * *